United States Patent
Feeney et al.

(10) Patent No.: US 6,355,565 B2
(45) Date of Patent: Mar. 12, 2002

(54) CHEMICAL-MECHANICAL-POLISHING SLURRY AND METHOD FOR POLISHING METAL/OXIDE LAYERS

(75) Inventors: Paul M. Feeney, Richmond; Timothy C. Krywanczyk, Essex Junction, both of VT (US); Lawrence D. David, Dover, NH (US); Matthew T. Tiersch, Essex Junction; Eric J. White, Charlotte, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/904,323

(22) Filed: Jul. 12, 2001

Related U.S. Application Data

(62) Division of application No. 08/997,290, filed on Dec. 23, 1997.

(51) Int. Cl.[7] ............................................. H01L 21/00
(52) U.S. Cl. ........................ 438/691; 438/692; 438/693
(58) Field of Search ............................... 438/690, 691, 438/692, 693; 252/79.1, 79.2; 451/36, 28, 41

(56) References Cited

U.S. PATENT DOCUMENTS

| | | |
|---|---|---|
| 4,415,606 A | 11/1983 | Cynkar er al. |
| 4,789,648 A | 12/1988 | Chow et al. |
| 4,879,257 A | 11/1989 | Patrick |
| 4,944,836 A | 7/1990 | Beyer et al. |
| 4,956,313 A | 9/1990 | Cote et al. |
| 4,992,135 A | 2/1991 | Doan |
| 5,142,828 A | 9/1992 | Curry, II |
| 5,328,553 A | 7/1994 | Poon |
| 5,340,370 A | 8/1994 | Cadien et al. |
| 5,389,194 A | 2/1995 | Rostoker et al. |
| 5,391,258 A | 2/1995 | Brancaleoni et al. |
| 5,506,182 A | 4/1996 | Yamagishi et al. |
| 5,527,423 A | 6/1996 | Neville et al. |
| 5,614,444 A | 3/1997 | Farkas et al. |
| 5,637,185 A | 6/1997 | Murarka et al. |
| 5,709,588 A | 1/1998 | Muroyama |
| 5,726,099 A | 3/1998 | Jaso |
| 5,770,103 A | 6/1998 | Wang et al. |
| 5,876,490 A | 3/1999 | Ronay |
| 5,993,685 A * | 11/1999 | Currie et al. ............... 252/79.1 |
| 5,993,686 A | 11/1999 | Streinz et al. |
| 6,083,419 A | 7/2000 | Grumbine et al. |
| 6,136,711 A * | 10/2000 | Grumbine et al. .......... 438/692 |
| 6,190,237 B1 * | 2/2001 | Huynh et al. ................. 451/41 |

OTHER PUBLICATIONS

European Patent Application EP0 773 269 A2, Filed Nov. 13, 1996, Applicant: Kabushiki Kaisha Toshiba Specifications and Drawings, 21 pgs.
IBM Technical Disclosure Bulletin vol. 33 No. 4 Sep. 1990 Title: Aluminum Metallurgy Rework Process, p. 240.
Chemical Mechanical Planarization of Microelectronic Materials By: Joseph M. Steigerwald, Shyam P. Murarka, Ronald J. Gutmann Library of congress Cataloging in Publication Data, 1997 pp. 36–47.
Research Report RC 16790 (#74323), Apr. 23, 1991, Engineering Technology, 12 pages Title: Chemical–Mechanical Polishing for Fabricating Patterned W Metal Features as Chip Interconnects Authors: F.B. Kaufm;an, R.E. Broadie, W.L. Guthrie, M.B. Small, D.B. Thompson, M.A. Jaso, D.J. Pearson.
IBM Technical Disclosure Bulletin vol. 35, No. 1B, Jun. 1992 Title: Multiple Level Integrated Circuit Rework Using Chemical Mechanical Polish and Reactive Ion Etch pp. 254–255.
IBM Technical Disclosure Bulletin vol. 37, No. 01, Jan. 1994 Title: Rework Process for Integrated Circuit Chip Pads p. 333.
SEMICON/Southwest 95, Austin, TX, Oct. 23, 1995, SEMI Technical Programs Present . . . Title: Chemical Mechanical Polishing—Metals Seminar (CMP) Authors: Volker Blaschke, Karey Holland, IPEC–Westech Systems, Inc. Phoenix, Arizona pp. 93–98.
CMP–MIC Conference, Feb. 22–23, 1996, 1996 ISMIC—100P/96/0145 Title: Chemical–Mechanical Polishing of Copper in Acidic Media Authors: Q. Luo, D.R. Campbell and S.V. Babu Clarkson University, Dept. of Chemical Engineering, Center for Advanced Materials Processing.

* cited by examiner

Primary Examiner—Benjamin L. Utech
Assistant Examiner—Lan Vinh
(74) Attorney, Agent, or Firm—Howard J. Walter, Jr.

(57) ABSTRACT

A ferric nitrate-alumina based slurry useful for Chemical-Mechanical-Polishing of tungsten metallurgy and silica based oxides on semiconductor substrates in which the suspension and stability of abrasive material in the slurry is essentially stable. The slurry formulation is balanced to provide low residue of foreign material after polishing and due to its reduced ferric nitrate concentration will be less corrosive than prior art slurries. The recipe for the slurry includes of a 30% wt silica suspension, about 800 ml of 40% by wt ferric nonahydrate, liters and enough 70% wt nitric acid to adjust the pH of the slurry to about 1.2 to 1.4.

8 Claims, No Drawings

CHEMICAL-MECHANICAL-POLISHING SLURRY AND METHOD FOR POLISHING METAL/OXIDE LAYERS

This application is a Div of Ser. No. 08/994,290 filed Dec. 23, 1994.

BACKGROUND OF THE INVENTION

1. Field of the Invention

This invention relates to the planarization of semiconductor devices by Chemical-Mechanical-Polishing (CMP) techniques and, more particularly, to the formulation of polishing slurries for metals and oxides where the rate of polishing allows both metal and oxide to be removed simultaneously. By use of the slurry of the invention process costs can be reduced and semiconductor wafers can be successfully reclaimed and re-processed.

2. Description of the Prior Art

Chemical-Mechanical-Polishing techniques are used in the semiconductor processing industry to enable interconnect metallurgy of the highest density to be fabricated. Based on the teachings in U.S. Pat. No. 4,789,648 to Chow et al. and U.S. Pat. No. 4,944,836 to Beyer et al., CMP has enabled the continued shrinking of semiconductor device dimensions by the practical and manufacturable introduction of planarization of metals or interlevel dielectrics to semiconductor processing. By maintaining the surface of a semiconductor device as flat as possible, the rendering of optical images of ever smaller size continues to be possible.

CMP technology used for planarization of inter-level dielectric (ILD) is usually performed in a strong basic solution having a high pH and relies heavily on the abrasive effects of silica particles. Technology for metals generally is based on the principles that most hard materials are reactive with oxidants to form oxides and other softer compounds which, in turn, can be polished away. As such the slurries used are usually strongly acidic and have low pH. If the process of reacting and polishing can be controlled sufficiently, semiconductor metallurgy will continue to lead the path to miniaturization.

In most CMP processes great effort is expended to increase the selectivity of a slurry between two materials present in the polishing environment. For example, if one is attempting to remove tungsten from an oxide layer, the preferred slurry would polish tungsten many times faster than oxide. The reverse is usually true when polishing oxides over metal layers.

It is known to planarize tungsten metallurgy by polishing with an aqueous slurry comprising alumina in ferric nitrate. See "PROCESS OPTIMIZATION OF TUNGSTEN CMP." V. Blaschke and K. Holland, Chemical Mechanical Polishing—Metals Seminar (CMP), SEMICON/Southwest '95; Austin, Tex.; Oct. 23, 1995. This slurry, when used in an IPEC-Westech Systems wafer polisher at a feedrate of about 125 ml per minute, has the capability of polishing tungsten at 3,000 Angstroms per minute. The slurry, however, has the following disadvantages:

1. The alumina colloidal suspension is unstable and the ferric nitrate solution must be agitated constantly to keep the suspension in solution. If left alone, the suspension collapses within a few hours rendering it impossible to formulate batches of slurry in advance. The settling of the alumina particles indicates that the particles are not well dispersed at all, a condition which could easily lead to scratching and cause other polishing irregularities since the slurry actually contains particulates and aggomerates large enough to settle out of suspension. This also can cause Foreign Material (FM) problems and loss of product yield.

2. The polishing slurry leaves rust residue on items throughout the CMP tool area. Whenever some slurry is spilled or sprayed, orange rust is left behind when the slurry dries. The stains are an indication that the ferric ion is prone to polymerizing to oxo-bridged species, leading to ferric-bearing oxide residues. These residues are a source of FM. The polymerization can also account for agglomeration of the alumina, as the polymerized ferric species likely promotes adhesion of alumina particles to each other. This condition often causes tools to be shut down for cleaning and removal of slurry cakes by the use of a hammer.

3. The heterogenity of the slurry also prohibits the bulk feeding of the slurry to the tools. Because the particulates in the slurry have a tendency to settle out, the particulates will precipitate out within any delivery system clogging tubing and valves.

4. The tendency of the ferric components to form rust residue causes corrosion wherever the slurry lands and dries on stainless steel parts of the polishing tools. This is a cause of FM problems and eventually destroys polisher components.

Other ferric-based salts have been proposed and include potassium ferricyanide as an oxidizer, combined with an acetate buffer and acetic acid using a silica abrasive as described in U.S. Pat. No. 5,407,526 to Danielson et al. and U.S. Pat. No. 5,516,346 to Cadien etal.

U.S. Pat. No. 5,527,423 to Neville et al. describes a polishing slurry for selectively polishing metals. The slurry includes ferric nitride nonahydrate and deionized water in which a special fumed alumina or silica is used to provide stability of particles in suspension. The disclosure also suggests other additives and stabilizers which may be added immediately prior to use. The differences in polish rates obtained are attributed to the high surface area fumed silica or alumina of the invention and the resulting slurry suitable for most metals Oxide slurries, see U.S. Pat. No. 4,944,836 to Beyer et al., are usually basic and may contain about 1 to 10% by weight silica in potassium hydroxide, for example. Recently acid stabilized silica slurries have become available, but these still exhibit instability when additional reagents are added to the slurry as surfactants or other surface controlling agents.

A typical planarized Back-End-Of-The-Line (BEOL) Field Effect Transistor (FET) process includes the following steps, as an example.

A semiconductor wafer is process up through the gate electrode and a first dielectric passivation layer. Via holes are formed and a contact metal is provided in the holes. Processing to this point in the process may or may not provide a planarized surface.

Following the initial process steps, an ILD layer, usually a phosphorous or boron containing glass is deposited. The ILD layer is planarized bu CMP technology selective to the deposited ILD layer. The planarization is followed by the etching of via holes or both via holes and lines in the ILD layer.

A metal, including any desired contact enhancing or barrier providing layer, is blanket deposited. The metal layer is then planarized by a CMP process selective to the metal with respect to the ILD. This step leaves either exposed metal studs coplanar with the top of the ILD or, in the case of dual Damascene processing, metal lines coplanar with the top of the ILD layer.

If dual Damascene is not practiced, a metal layer for the lateral interconnects between studs is deposited and etched to define the level of metal, usually designated Mn where n is the number of the level above the substrate. In the case of dual Damascene, the Mn level is part of the deposited and planarized metal already deposited.

U.S. Pat. No. 4,956,313 to Cote et al. teaches a process in which the planarization following the first ILD layer may be omitted and a slurry comprising 40 grams of alumina in 10 liters of deionized water to which strong oxidizing agent, hydrogen peroxide, and a strong base, potassium hydroxide, is added adjusting the pH to 8.4. Selectivity of oxide to tungsten was about 200/300 Angstroms per minute and produced coplanar polished layers.

M. A. Jaso, in his published European application EP 0 773 580 A1 published Oct. 21, 1996, teaches a post tungsten slurry comprising fumed colloidal silica, 8% wt, and 20 g/l ammonium persulfate which is said to be non-selective between tungsten and oxide.

A major problem presented to manufacturers is that of reworking of product because some aspect of a process has been unacceptably performed. Reworking of BEOL processes are quite well known are may be represented by the following references.

U.S. Pat. No. 4,415,606 to Cynkar et al. teaches a rework process for metallurgy in which portions of deposited and etched metal are selectively etched from a substrate.

The article, "Rework Process for Integrated Circuit Chip Pads," Annon., IBM Technical Disclosure Bulletin, Vol. 37, No.01, January 1994, p 333, teaches rework process in which each added layer is removed in turn by a process selective to that material.

The article, "ALUMINUM METALLURGY REWORK PROCESS," Annon., IBM Technical Disclosure Bulletin, Vol. 33, No.4, September 1990, p.240, teaches that rework can be accomplished by first selectively etching away an aluminum line and then using CMP to remove the ILD layer.

The article, "MULTIPLE LEVEL INTEGRATED CIRCUIT REWORK USING CHEMICAL MECHANICAL POLISH AND REACTIVE ION ETCHING," Annon., IBM Technical Disclosure Bulletin, Vol. 35, No.1B, June 1992, pp 254–5, which teaches the use of an reaction ion etching (RIE) tool to remove oxide followed by CMP or RIE to selectively remove the metal.

U.S. Pat. No. 4,879,257 to Patrick teaches a method of coplanarizing metal, photoresist and ILD layers simultaneously using RIE or plasma etching.

U.S. Pat. No. 5,142,828 to Curry, II teaches the reworking of a BEOL processed wafer where the ILD is a polyimide polymer and the metal is copper by polishing with a slurry including only silica in water.

SUMMARY OF THE INVENTION

There is a need for a slurry capable of coplanarizing metal and dielectric which does not include problems found in prior art slurries such as stability of suspension of abrasive, stability of activity of reagents and avoid the FM problems with current ferric containing slurries.

Thus, an improved slurry must avoid all of the above problems and also be capable of polishing both metal and dielectric at a substantially equal rate.

It is therefore an object of the invention to provide an effective slurry for polishing tungsten and oxides that maintains a high polish rate while reducing the quantity of chemicals used.

It is another object of the invention to provide a polishing slurry in which the abrasive particulates are truly dispersed in solution and do not separate out of solution.

It is yet another object of the invention to provide a polishing slurry in which metal contaminates are maintained in solution and do not precipitate out of solution.

Another object of the invention is to provide more efficient polishing slurries in which scratching is reduced because particles do not agglomerate.

It is another object of the invention to provide a slurry which will reduce the number of process steps necessary to fabricate BEOL technology.

It is yet another object of the invention to provide a slurry which will simplify the reworking of semiconductor wafers.

These and other objects of the invention are achieved by providing a slurry for CMP polishing comprising an silica abrasive, an oxidizer having an anion which forms soluble salts with metals having atomic numbers less than 83, water and an acid having the same anion as the oxidizer. More specifically, a CMP polishing slurry comprising ferric nonahydrate, an acid stabilized silica, acid and water. More specifically the slurry comprises 800 ml of 40% aqueous ferric nonahydrate added to about 3.75 liters of acid stabilized 30% by weight fumed silica and pH balanced with nitric acid to a range of 1.2 to 1.4.

These and other objects of the invention will become more apparent when viewed in the light of the following description of the preferred embodiment.

DESCRIPTION OF THE PREFERRED EMBODIMENT

In fabricating semiconductor devices using tungsten metal/insulator thin layers, the following steps are currently necessary:

1. About 11,500 Angstroms of phosphorus doped glass (PSG) is deposited as an insulator layer over polysilicon gate stack structures.
2. The PSG layer must be planarized by CMP polishing. Current slurries have included silica slurries comprising about 12% silica and water in a strong basic at a ph of about 10.
3. The polished surface must then be cleaned, preferably by brush cleaning and then washed with 500:1 solution of buffered hydrofluoric acid.
4. Via holes are then etched in the PSG layer.
5. The via holes are filled using a barrier layer liner and blanket tungsten.
6. The tungsten is polished off using a CMP slurry of alumina/ ferric nitrate followed by a touch up polish using a silica based slurry leaving the top surface of the PSG coplanar with the tungsten in the via holes.

The disadvantages of this method are:

separate polish/slurry steps are necessary for planarizing the oxide and tungsten and a third polish step is needed for touch up after the tungsten polish.

the brush clean station is notorious for leaving all sorts of Foreign Material (FM) on the product.

the primary tungsten polish causes various degrees of scratching in the metal and PSG due to the agglomeration of alumina in the slurry. These defects are transmitted into subsequent layers applied to the semiconductor device due to the scratch patterns left in the surfaces of the PSG/tungsten. Because alumina is relatively hard (high on the Moh's hardness scale (alpha alumina=9 and gamma alumina=8) compared with a hardness of 6 or 7 for silica, it scratches PSG and other glass oxides severely.

A practical method for planarizing tungsten and insulator in one step has been sought for many years. Such a method would eliminate: two polish steps per ILD level of metallurgy, one clean up step, and a rinse step.

Requirement for such a slurry are the capability to polish tungsten and the oxide at nearly the same rate. The difference in rates should not exceed the other by more that about three times and is preferable to be as close to 1:1 as possible.

Also desirable is the elimination of abrasive caused scratching which when filled with subsequently deposited tungsten or other metal capable of shorting out adjacent lines and causing devices to fail.

The single step slurry should also be chemically stable, it should be capable of remaining dispersed for long periods of time, preferably indefinitely, without agglomerating or precipitating out of solution.

Any oxidizer should not decompose upon standing,. Oxidizers previously proposed including those with peroxo bonds such as hydrogen peroxide and persulfates are unsuitable because they decompose on standing, especially when in the presence of abrasives. Metal contamination and raised temperatures both contribute to early decomposition of these oxidizers. Slurries using these oxidizers have been found to produce unpredictable results.

Any replacement slurry should also be capable of bulk handling such that more precise control over quantities used can be made.

The following describes the reactions believed to be important in a slurry for etching tungsten.

CMP technology has been practiced for many years and is based on the principle that relatively hard materials can be polished, or more properly planarized, by a combination of a chemical conversion of the material to a softer compound and the physical removal of that softer material with an abrasive process. The basis of CMP of many metals is the surface oxidation of the metal followed by the abrasive removal of the oxide. In the case of tungsten the preferred oxidant is the ferric ion and the following reaction.

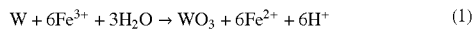

$$W + 6Fe^{3+} + 3H_2O \rightarrow WO_3 + 6Fe^{2+} + 6H^+ \quad (1)$$

$$E^0 = 0.86 \text{ v}$$

The ferrous ion is oxidized back to ferric by the nitrate ion by the following reaction.

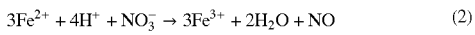

$$3Fe^{2+} + 4H^+ + NO_3^- \rightarrow 3Fe^{3+} + 2H_2O + NO \quad (2)$$

$$E^0 = 0.19 \text{ v}$$

thus sustaining the reaction rate.

The oxide, $WO_3$, is then removed by the alumina ($Al_2O_3$) abrasive exposing additional unoxidized tungsten which undergoes more oxidation, etc. until the process is terminated.

The problem of providing a true dispersion of a solid oxide in aqueous suspension is best considered by knowing the electrical charge on the oxide particles. All oxides suspended in water exhibit a characteristic pH. Oxide particulates will cause a solution to exhibit a pH at which their surfaces will exhibit no net charge, the iso-electric point (IEP). In order for particles of an oxide to repel each other in suspension, the pH must be set either several unit more basic than the IEP (imparting negative charge) or several units more acidic (imparting positive charge). When the pH is thus set, the like-charged particles mutually repel and the suspension remains dispersed. If the ionic strength is raised too high, the surface charge around the particles is disrupted and the suspension collapses.

The addition of ferric nitrate to the suspension swings the pH down to the vicinity of about 1.5 and the suspension turns a yellow-brown color. The chemistry of the ferric ion in aqueous solution accounts for this result. Ferric ions in aqueous solution is actually a moderate strength acid:

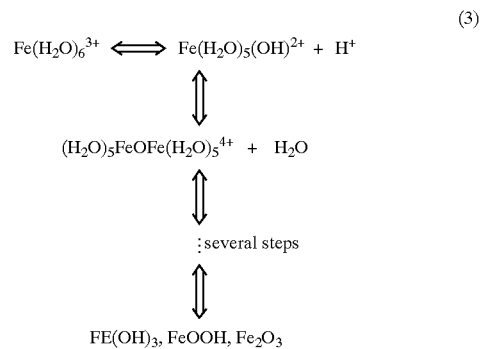

(3)

Ferric ion thus tends to dissociate protons and to polymerize. The polymer species imparts the characteristic brown color to solutions containing ferric ions. The $Fe(H_2O)_6^{3+}$ ion is actually pale violet.

These polymers also can bridge alumina particles inducing agglomeration. This phenomenon is exactly what occurs in the slurry mix if allowed to sit for any period of time. It therefore becomes necessary to constantly agitate the ferric nitrate/alumina slurry with a nitrogen gas bubbler. Because of the tendency to agglomerate, the slurry cannot be pumped any great distance from the polishing tool.

It has been found that:

1. The amount of ferric nitrate in the previous slurry was excessive and resulted in making the alumina more difficult to disperse. For a 1:1 oxide/tungsten slurry we prefer about 800 ml of 40% aqueous ferric nitrate nonahydrate ($Fe(NO_3)_3 \cdot 9H_2O$) in about 3.75 liters of aqueous feed solution.
2. Nitric acid ($HNO_3$) is added to the slurry to shift the equilibrium of the oxo-bridged ferric species back toward the $Fe(H_2O)_6^{3+}$ ion. This combination yields a suspension of far superior stability. The breakup of the ferric ion polymers suppresses agglomeration of the alumina particles. The amount of nitric acid found to be optimum was about 25 ml of 70% nitric acid per liter of $Fe(NO_3)_3$ feedstock solution or to 4.5 liters of slurry. Significantly higher amounts of nitric acid, say 100 ml, will cause the suspension to collapse. The color of the acidified, ferric nitrate/alumina is white and upon drying does not precipitate out a rust-colored stain.

The improvement of the slurry of the invention over the previously used slurry is evident from the following comparison. When old and new slurries are allowed to stand, it was observed that the old slurry began to settle almost immediately and would be completely settled, the solution clear, after about four hours. The slurry of the invention was not observed to settle after a 24 hours except for some fines which were observed on the bottom of the sample.

The superior stability of the slurry offers the opportunity of providing a bulk feed system for delivering slurry to polishing tools. Previously, slurry had to be mixed just prior to use at the polishing tool.

The choice of nitric acid for the acidification step is not trivial to adjust the pH to the required level to prevent agglomeration. Nitric acid places additional nitrate anion in the slurry.

This is the same anion already in the slurry as the oxidizer, ferric nitrate. An additional advantage is gained as all metal nitrates, where the metal has an Atomic number less than 83, are soluble and the addition of nitric acid cannot cause the formation of any non-soluble metal nitrate to precipitate our of solution. Other ferric salts and conjugate acids are not as forgiving. For example, ferric sulfate or ferric ammonium sulfate, with sulfuric acid, lacks the nitrate reoxidation feature (Equation 2) of the slurry of the invention and also raises the risk that metal sulfates, such as magnesium and calcium, will precipitate out of solution.

The reduction in the amount of ferric nitrate used in a previous slurry also has the additional benefit of providing a like reduction in the cost of chemicals used for slurry. In a large wafer fab upwards of $250,000 a year might be saved.

The slurry of the invention provides nearly equal polish rates for PSG oxide and tungsten.

Attempts to use slurries designed to be selective will for tungsten slurries over etch the tungsten studs leaving them recessed. Use of a PSG slurry will cause the PSG to be recessed below the tungsten.

The slurry comprises a mixture of acid -stabilized colloidal silica including about 30% by weight fumed silica obtainable as Klebosol from Hoechst AG, ferric nitrate as an oxidized, nitric acid to prevent the ferric nitrate from polymerizing or agglomerating. Other acid stabilized silica sols should also work in this environment.

The slurry is mixed by placing 3,785 liters of Klebosol (30% by weight in water, pH=about 2.3. Particle size should be about 25 to 50 Angstroms). To which enough 70% nitric acid is added to drop the pH down to a pH of 1.7 This should not require more than 5–20 ml of nitric acid., then about 800 ml of 40% aqueous ferric nonahydrate. The final ph of the slurry should be about 1.2 to 1.4.

In a Westech polishing tool using a standard tungsten polishing pad, 60 rpm platen, 60 rpm quill motor and a slurry feed rate of about 100 ml per minute, composite polishing rate in Angstroms per minute for tungsten and PSG of 2,850/1,625 to 2,475/1.050 were achieved as a good coplanar surface was achieved.

In contrast, When SCE silica slurry was mixed in the same proportions was mixed with the same chemicals, it was found that the polishing rate for tungsten was 3,650 Angstroms per minute while the PSG polished at a mere 300 Angstroms per minute causing the tungsten studs to be recessed considerably below the top of the PSG layer.

It is believed that other oxidizers can also be used in the slurries of the invention so long as they do not decompose on standing. Thus, one could use ferricyanide in place of ferric nitrate. In addition other types of stabilized silica colloids could also be used.

With the slurry of the invention, a single step and slurry are needed to planarize a level of intermetallic layer as both ILD and metal can be polished simultaneously. The slurry is stable chemically, and resists settling or precipitation of the abrasive.

Because the slurry of the invention allows the polishing of both oxide and metal, semiconductor wafers exhibiting defects following the deposition and polishing as described above can be salvaged by using the slurry of the invention to partially or completely polish away the entire level of metallurgy.

Should one wish to rework a particular level, polishing and monitoring the PSG and stud level will allow complete removal of interconnection layers. Wafers can then be returned to the PSG process tool and then to the tungsten tool.

In some instances it may be desirable to leave portions of the stud level on the substrate and to reinitiate the process by retaining a half-level of studs.

While the invention has been described in terms of limited embodiments, it will be apparent to those skilled in the art that various modifications may be made in the details of the invention without straying from the spirit and claims of the invention.

What is claimed is:

1. The method of polishing tungsten and a dielectric layer comprising the steps of:

provided a semiconductor wafer having a layer of tungsten over a layer of dielectric on a polishing pad capable of rotating;

dispensing a slurry consisting of ferric nitrate, a silica dispersion and water, acidified by nitric acid to a pH of about 1.2 to 1.4 to contact the interface between the tungsten and the polishing pad; and polishing said wafer until said layer of tungsten and dielectric layer become coplanar.

2. The method of claim 1 wherein said slurry is dispensed at a rate of about 100–125 ml per minute.

3. The method of claim 2 wherein said silica dispersion comprises about 30% by weight of silica in 3.75 liters of said dispersion.

4. The method of reworking the metallurgy level of a semiconductor substrate comprising the steps of:

applying a composite layer of interlevel dielectric and metallic interconnection lines or vias;

processing the composite layer in a single chemical mechanical polishing slurry consisting of stabilized silica, ferric nitrate, water and nitric acid sufficient to provide a pH of between 1.2 and 1.4 in a single step to remove at least part of the thickness of said composite layer.

5. The method of claim 4 wherein the metal is tungsten and the interlevel dielectric is a PSG.

6. The method of claim 4 wherein said processing step continues until the entire thickness of said composite level is removed.

7. The method of claim 4 wherein said processing step stops when only a portion of the thickness of said composite level is removed.

8. The method of claim 7 wherein said processing step continues until a half-level of the thickness of said composite level is removed.

* * * * *